(12) United States Patent
Abe et al.

(10) Patent No.: US 10,088,133 B2
(45) Date of Patent: Oct. 2, 2018

(54) MOUNTING SUBSTRATE, LIGHT-EMITTING APPARATUS, AND ILLUMINATION APPARATUS

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/875,316

(22) Filed: Jan. 19, 2018

(65) Prior Publication Data

US 2018/0216803 A1 Aug. 2, 2018

(30) Foreign Application Priority Data

Jan. 27, 2017 (JP) ................................. 2017-013720

(51) Int. Cl.
*H01L 33/00* (2010.01)
*F21V 19/00* (2006.01)
(Continued)

(52) U.S. Cl.
CPC ............ *F21V 19/0025* (2013.01); *F21V 9/08* (2013.01); *F21V 19/002* (2013.01); *H01L 25/0753* (2013.01); *H01L 33/486* (2013.01); *H01L 33/62* (2013.01); *H05K 1/0274* (2013.01); *H05K 2201/10106* (2013.01)

(58) Field of Classification Search
CPC . H01L 25/167; H01L 25/0753; H01L 27/156; H01L 33/382; H01L 33/385; H01L 33/387; H01L 33/486; H01L 2224/48137; H01L 24/48; H01L 24/97; H01L 33/62; F21V 19/0025; H05K 2201/10106
See application file for complete search history.

(56) References Cited

U.S. PATENT DOCUMENTS

2011/0278605 A1 11/2011 Agatani et al.
2012/0080713 A1 4/2012 Agatani et al.
(Continued)

FOREIGN PATENT DOCUMENTS

JP 2012-004519 1/2012
JP 2012-079855 4/2012
(Continued)

*Primary Examiner* — Thanh Y Tran
(74) *Attorney, Agent, or Firm* — Greenblum & Bernstein, P.L.C.

(57) ABSTRACT

A mounting substrate includes: a substrate; a first terminal, a fifth terminal, and a sixth terminal which are disposed in a first region; a second terminal disposed in a second region; a third terminal and a seventh terminal which are disposed in a third region; and a fourth terminal disposed in a fourth region. The mounting substrate includes: a first connecting line which electrically connects the fifth terminal and the second terminal; a second connecting line which electrically connects the sixth terminal and the third terminal; and a third connecting line which electrically connects the seventh terminal and the fourth terminal.

15 Claims, 9 Drawing Sheets

(51) Int. Cl.
*F21V 9/08* (2018.01)
*H01L 33/62* (2010.01)
*H01L 33/48* (2010.01)
*H05K 1/02* (2006.01)
*H01L 25/075* (2006.01)

(56) References Cited

U.S. PATENT DOCUMENTS

| | | | | |
|---|---|---|---|---|
| 2013/0193862 A1* | 8/2013 | Sasano | ................ | H01L 25/0753 |
| | | | | 315/192 |
| 2013/0194795 A1* | 8/2013 | Onaka | ....................... | F21V 5/04 |
| | | | | 362/231 |
| 2015/0016109 A1 | 1/2015 | Ogata et al. | | |
| 2015/0041835 A1* | 2/2015 | Agatani | .............. | H01L 25/0753 |
| | | | | 257/88 |
| 2015/0176820 A1 | 6/2015 | Abe et al. | | |
| 2015/0207048 A1* | 7/2015 | Ishizaki | .................... | F21V 3/00 |
| | | | | 257/91 |
| 2015/0359088 A1* | 12/2015 | Konishi | ............. | H01L 25/0753 |
| | | | | 257/98 |
| 2017/0012189 A1* | 1/2017 | Hata | .................... | H05K 1/0269 |
| 2018/0069162 A1* | 3/2018 | Abe | .................... | H01L 25/0753 |

FOREIGN PATENT DOCUMENTS

| | | |
|---|---|---|
| JP | 2014-127554 | 7/2014 |
| JP | 2015-035601 | 2/2015 |
| JP | 2015-122377 | 7/2015 |

\* cited by examiner

MOUNTING SUBSTRATE, LIGHT-EMITTING APPARATUS, AND ILLUMINATION APPARATUS

CROSS REFERENCE TO RELATED APPLICATION

This application claims the benefit of priority of Japanese Patent Application Number 2017-013720 filed on Jan. 27, 2017, the entire content of which is hereby incorporated by reference.

1. Technical Field

The present disclosure relates to a mounting substrate, a light-emitting apparatus which includes the mounting substrate, and an illumination apparatus which includes the light-emitting apparatus.

2. Description of the Related Art

Japanese Unexamined Patent Application Publication No. 2015-122377 discloses a chip on board (COB) light-emitting apparatus (light-emitting module) in which a light-emitting diode (LED) chip mounted on a substrate is sealed by a sealant formed using a resin that contains phosphors.

SUMMARY

In a light-emitting apparatus, the electrical connection relationship of LED chips mounted on a substrate is determined by a wiring pattern formed on the substrate. Accordingly, the electrical connection relationship of LED chips already mounted on a substrate cannot be changed.

The present disclosure provides a mounting substrate, a light-emitting apparatus, and an illumination apparatus which can change the electrical connection relationship of a plurality of light-emitting elements already mounted.

A mounting substrate according to an aspect of the present disclosure is a mounting substrate on which a first light-emitting element group and a second light-emitting element group are mounted, the mounting substrate including: a substrate having a principal surface which includes a first region, a second region, a third region, and a fourth region, and in which the first region and the third region are aligned in a first direction and the second region and the fourth region are aligned in a second direction which crosses the first direction; a first terminal which is disposed in the first region, and is electrically connected with a first electrode of the first light-emitting element group; a second terminal which is disposed in the second region, and is electrically connected with a first electrode of the second light-emitting element group; a third terminal which is disposed in the third region, and is electrically connected with a second electrode of the second light-emitting element group; a fourth terminal which is disposed in the fourth region, and is electrically connected with a second electrode of the first light-emitting element group; a fifth terminal disposed in the first region; a sixth terminal disposed in the first region; a seventh terminal disposed in the third region; a first connecting line which is disposed on the principal surface, and electrically connects the fifth terminal and the second terminal; a second connecting line which is disposed on the principal surface, and electrically connects the sixth terminal and the third terminal; and a third connecting line which is disposed on the principal surface, and electrically connects the seventh terminal and the fourth terminal.

A light-emitting apparatus according to an aspect of the present disclosure includes: the mounting substrate; the first light-emitting element group mounted on the mounting substrate; and the second light-emitting element group mounted on the mounting substrate.

An illumination apparatus according to an aspect of the present disclosure includes: the light-emitting apparatus; a base member on which the light-emitting apparatus is placed; a holder which includes a first pressing terminal, a second pressing terminal, and a third pressing terminal, and fixes the light-emitting apparatus to the base member; and a circuit element included in a power supply circuit which supplies, between the first pressing terminal and the second pressing terminal, power for causing the light-emitting apparatus to emit light, wherein when the light-emitting apparatus is placed in a first orientation, the first pressing terminal collectively presses the first terminal and the fifth terminal, the second pressing terminal collectively presses the third terminal and the seventh terminal, and the third pressing terminal presses the second terminal, and when the light-emitting apparatus is placed in a second orientation rotated 90 degrees from the first orientation about an optical axis, the first pressing terminal presses the fourth terminal, the second pressing terminal presses the second terminal, and the third pressing terminal collectively presses the first terminal and the sixth terminal.

According to the present disclosure, a mounting substrate, a light-emitting apparatus, and an illumination apparatus which can change the electrical connection relationship of a plurality of light-emitting elements already mounted can be achieved.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Figure 1:
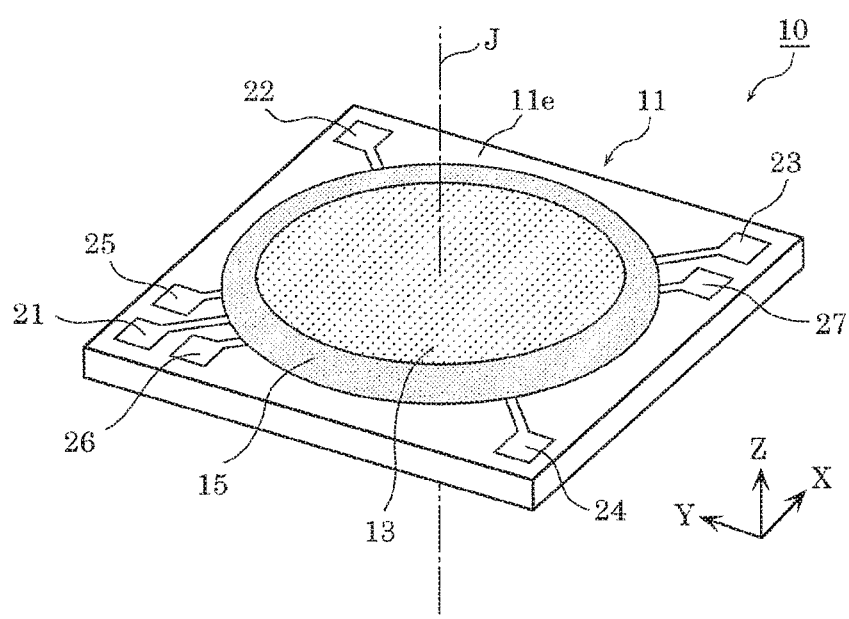
FIG. 1 is an external perspective view of a light-emitting apparatus according to Embodiment 1.

The following describes embodiments with reference to the drawings. Note that the embodiments described below each show a general or particular example. The numerical values, shapes, materials, elements, and the arrangement and connection of the elements, for instance, described in the following embodiments are examples, and thus are not intended to limit the present disclosure. Therefore, among the elements in the following embodiments, elements not recited in any of the independent claims defining the most generic part of the present disclosure are described as arbitrary elements.

Note that the diagrams are schematic diagrams, and do not necessarily provide strict illustration. In the drawings, the same numeral is given to a substantially same configuration, and a redundant description thereof may be omitted or simplified. Further, in the following embodiments, "approximately" or "about" means that a manufacture error and dimensional tolerance, for instance, are included.

In addition, the drawings used to give explanation in the following embodiments may show a coordinate axis. The Z-axis direction of the coordinate axis is, for example, the perpendicular direction, the positive side of the Z axis is expressed as the upper side (upper part), and the negative side of the Z axis is expressed as the lower side (lower part). In other words, the Z-axis direction is perpendicular to a substrate included in a light-emitting apparatus. The X-axis direction and the Y-axis direction are orthogonal to each other on a plane (level surface) perpendicular to the Z-axis direction. The X-Y plane is parallel to a principal surface of the substrate included in the light-emitting apparatus. In the following embodiments, a "plan view" means a view in the Z-axis direction, for example.

Embodiment 1

[Configuration of Light-Emitting Apparatus]

Figure 2:
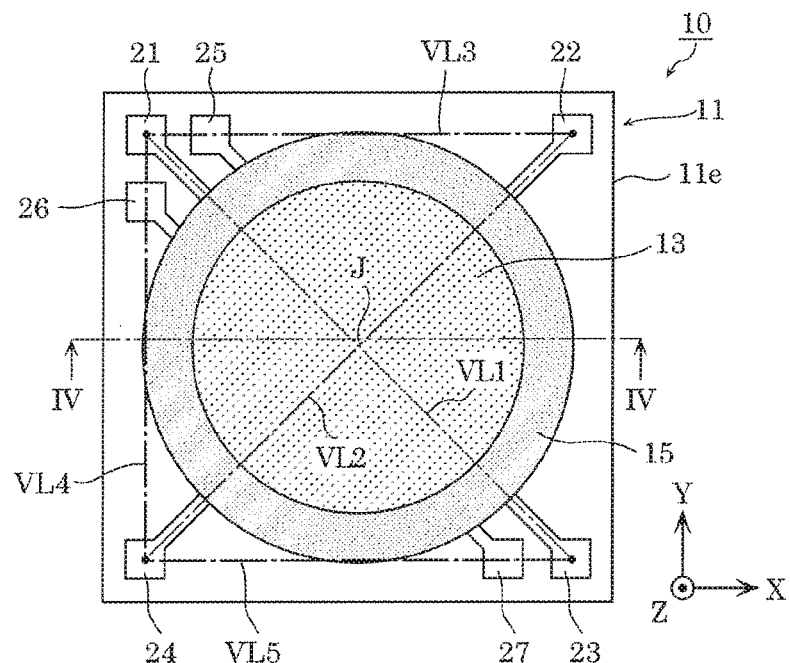
FIG. 2 is a plan view of the light-emitting apparatus according to Embodiment 1.
Figure 3:
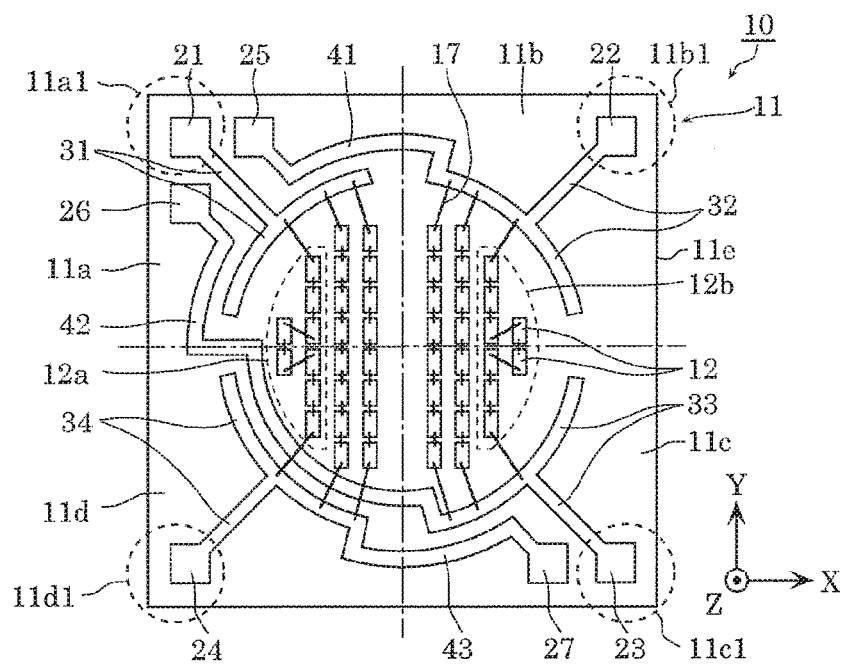
FIG. 3 is a plan view illustrating an internal structure of the light-emitting apparatus according to Embodiment 1.
Figure 4:
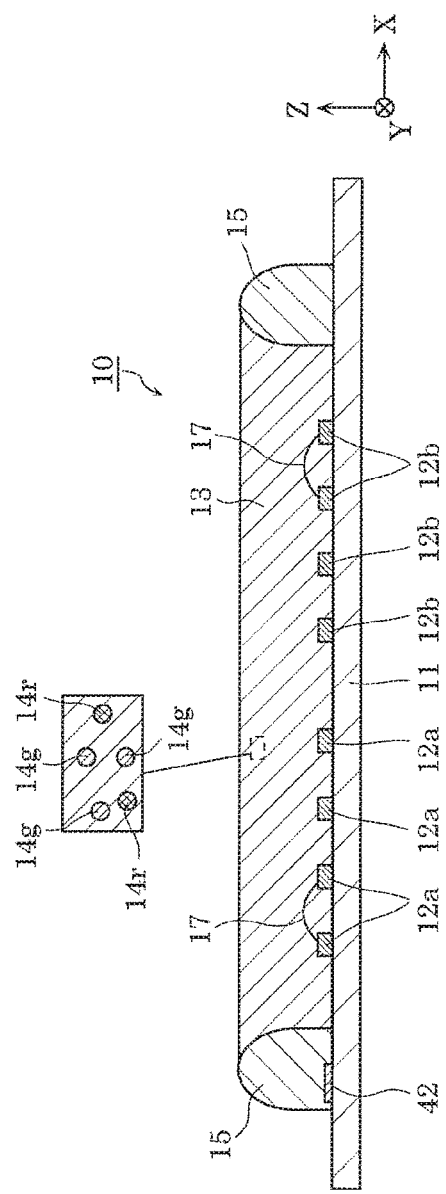
FIG. 4 is a schematic cross sectional view taken along line IV-IV in FIG. 2.

The first describes a configuration of a light-emitting apparatus according to Embodiment 1 with reference to the drawings. FIG. 1 is an external perspective view of the light-emitting apparatus according to Embodiment 1. FIG. 2 is a plan view of the light-emitting apparatus according to Embodiment 1. FIG. 3 is a plan view illustrating an internal structure of the light-emitting apparatus according to Embodiment 1. FIG. 4 is a schematic cross sectional view taken along line IV-IV in FIG. 2. Note that FIG. 3 mentioned above is a plan view equivalent to FIG. 2 from which sealant 13 and annular wall 15, for instance, are removed, and illustrating an internal structure such as the arrangement of LED chips 12, and a wiring pattern.

As illustrated in FIGS. 1 to 4, light-emitting apparatus 10 according to Embodiment 1 includes mounting substrate 11, LED chips 12, sealant 13, annular wall 15, and a plurality of bonding wires 17. LED chips 12 are divided into a plurality of first light-emitting element groups 12a and a plurality of second light-emitting element groups 12b. Light-emitting apparatus 10 is a so-called chip on board (COB) LED module in which LED chips 12 are directly mounted on mounting substrate 11, and emits white light. Note that light-emitting apparatus 10 may include at least one first light-emitting element group 12a and at least one second light-emitting element group 12b.

[Mounting Substrate]

The first describes a configuration of mounting substrate 11. Mounting substrate 11 includes substrate 11e (main body of the substrate), a plurality of terminals, and a plurality of lines.

Substrate 11e is a substrate on which LED chips 12 are disposed. Substrate 11e is a metal-based substrate or a ceramic substrate, for example. Substrate 11e may be a resin substrate whose base material is resin.

As the ceramic substrate, an alumina substrate made of aluminum oxide (alumina) or an aluminum nitride substrate made of aluminum nitride, for instance, is employed. As the metal-based substrate, an aluminum alloy substrate, an iron alloy substrate, or a copper alloy substrate which has a surface on which an insulating film is formed is employed, for example. As the resin substrate, a glass epoxy substrate made of glass fiber and an epoxy resin is employed, for example.

Note that a substrate having, for example, a high light reflectance (a light reflectance of 90% or higher, for example) may be employed as substrate 11e. By employing a substrate having a high light reflectance as substrate 11e, light emitted by LED chips 12 can be reflected off the surface of substrate 11e. As a result, the light extraction efficiency of light-emitting apparatus 10 improves. An example of such a substrate is a white ceramic substrate whose base material is alumina.

A light-transmitting substrate having a high light transmittance may be employed as substrate 11e. Examples of such a substrate include a light-transmitting ceramic substrate made of polycrystalline alumina or aluminum nitride, a transparent glass substrate made of glass, a crystal substrate made of crystal, a sapphire substrate made of sapphire, and a transparent resin substrate made of a transparent resin material.

Note that substrate 11e has a quadrilateral (square) shape in a plan view, but may have other shapes such as a round shape.

As illustrated in FIG. 3, the principal surface of substrate 11e includes first region 11a, second region 11b, third region 11c, and fourth region 11d. When the principal surface of substrate 11e is equally divided into four regions along an imaginary line extending along the X axis and an imaginary line extending along the Y axis, first region 11a is on the negative side of the X axis and the positive side of the Y axis among the four regions. Similarly, second region 11b is on the positive side of the X axis and the positive side of the Y axis among the four regions. Third region 11c is on the positive side of the X axis and the negative side of the Y axis among the four regions. Fourth region 11d is a region on the negative side of the X axis and the negative side of the Y axis among the four regions.

First region 11a and third region 11c are aligned in a first direction, and second region 11b and fourth region 11d are aligned in a second direction that crosses the first direction. Note that the first direction extends along a straight line indicated by Y=−X, and the second direction extends along a straight line indicated by Y=X. Specifically, the first direction and the second direction are thus orthogonal to each other.

Note that such arrangement of the four regions is an example. The four regions may be disposed in such a manner that first region 11a and third region 11c are aligned in the first direction and second region 11b and fourth region 11d are aligned in the second direction that crosses the first direction.

[Terminals]

The following describes terminals (terminal electrodes) disposed on the principal surface of substrate 11e, mainly with reference to FIGS. 2 and 3. Mounting substrate 11 includes first terminal 21, second terminal 22, third terminal 23, fourth terminal 24, fifth terminal 25, sixth terminal 26, and seventh terminal 27. The shapes of the terminals are quadrilateral (square) in a plan view, but are not limited in particular. In addition, the arrangement of the terminals as below is an example, and may be changed as appropriate. The terminals and bonding wires 17 are formed using a metal material such as gold (Au), silver (Ag), or copper (Cu). First, first terminal 21, second terminal 22, third terminal 23, and fourth terminal 24 are described.

First terminal 21 is disposed in first region 11a of the principal surface of substrate 11e. Specifically, first terminal 21 is disposed in first corner portion 11a1 included in first region 11a. First terminal 21 is electrically connected with a first electrode (for example, positive electrode (anode)) of first light-emitting element group 12a by first line 31 and bonding wire 17. The embodiment gives a description assuming that the first electrode of first light-emitting element group 12a is a positive electrode (anode), yet the first electrode may be a negative electrode (cathode).

Second terminal 22 is disposed in second region 11b of the principal surface of substrate 11e. Specifically, second terminal 22 is disposed in second corner portion 11b1 included in second region 11b. Second terminal 22 is electrically connected with a first electrode of second light-emitting element group 12b by second line 32 and bonding wire 17. The embodiment gives a description assuming that the first electrode of second light-emitting element group 12b is a positive electrode, yet the first electrode may be a negative electrode.

Third terminal 23 is disposed in third region 11c of the principal surface of substrate 11e. Specifically, third terminal 23 is disposed in third corner portion 11c1 included in third region 11c. Third terminal 23 is electrically connected with a second electrode of second light-emitting element group 12b by third line 33 and bonding wire 17. The embodiment gives a description assuming that the second electrode of second light-emitting element group 12b is a negative electrode, but the second electrode may be a positive electrode.

Fourth terminal 24 is disposed in fourth region 11d of the principal surface of substrate 11e. Specifically, fourth terminal 24 is disposed in fourth corner portion 11d1 included in fourth region 11d. Fourth terminal 24 is electrically connected with a second electrode of first light-emitting element group 12a by fourth line 34 and bonding wire 17. The embodiment gives a description assuming that the second electrode of first light-emitting element group 12a is a negative electrode, yet the second electrode may be a positive electrode.

A positional relationship of first terminal 21, second terminal 22, third terminal 23, and fourth terminal 24 described above is as follows. Note that in the following embodiments, the distance between terminals means the distance in a plan view between the center position of a terminal and the center position of another terminal.

Imaginary line VL1 which connects first terminal 21 and third terminal 23 is as long as and orthogonal to imaginary line VL2 which connects second terminal 22 and fourth terminal 24. The distance between first terminal 21 and second terminal 22, the distance between second terminal 22 and third terminal 23, the distance between third terminal 23 and fourth terminal 24, and the distance between fourth terminal 24 and first terminal 21 are equal. Specifically, the four terminals, namely first terminal 21, second terminal 22, third terminal 23, and fourth terminal 24 are disposed on the principal surface of substrate 11e in the positions of the vertexes of the square.

The following describes fifth terminal 25, sixth terminal 26, and seventh terminal 27. Fifth terminal 25 is disposed in first region 11a of the principal surface of substrate 11e. Specifically, fifth terminal 25 is disposed in a position slightly closer to the positive side of the X axis than first terminal 21. Fifth terminal 25 is electrically connected with second terminal 22 by first connecting line 41 and second line 32.

Sixth terminal 26 is disposed in first region 11a of the principal surface of substrate 11e. Specifically, sixth terminal 26 is disposed in a position slightly closer to the negative side of the Y axis than first terminal 21. Sixth terminal 26 is electrically connected with third terminal 23 by second connecting line 42 and third line 33.

Seventh terminal 27 is disposed in third region 11c of the principal surface of substrate 11e. Specifically, seventh terminal 27 is disposed in a position slightly closer to the negative side of the X axis than third terminal 23. Seventh terminal 27 is electrically connected with fourth terminal 24 by third connecting line 43 and fourth line 34.

The positional relationship of fifth terminal 25, sixth terminal 26, and seventh terminal 27 described above is as follows.

In a plan view, fifth terminal 25 is located on imaginary line VL3 which connects first terminal 21 and second terminal 22. In a plan view, sixth terminal 26 is located on imaginary line VL4 which connects first terminal 21 and fourth terminal 24. In a plan view, seventh terminal 27 is located on imaginary line VL5 which connects third terminal 23 and fourth terminal 24.

The distance between first terminal 21 and fifth terminal 25, the distance between first terminal 21 and sixth terminal 26, and the distance between third terminal 23 and seventh terminal 27 are equal.

[Lines]

The following describes lines disposed on the principal surface of substrate 11e, mainly with reference to FIGS. 2 and 3. Mounting substrate 11 includes first line 31, second line 32, third line 33, fourth line 34, first connecting line 41, second connecting line 42, and third connecting line 43. The lines are formed using a metal material such as gold (Au), silver (Ag), or copper (Cu), for example.

Note that the term "shape" in the following description of lines means a shape in a plan view, unless specifically indicated. Furthermore, the shape of the lines as below is an example, and may be changed as appropriate. The first describes first line 31, second line 32, third line 33, and fourth line 34.

First line 31 is disposed in first region 11a, and electrically connects first terminal 21 and the first electrode of first light-emitting element group 12a. First line 31 includes an arc-shaped portion to which bonding wire 17 for electrically connecting first light-emitting element group 12a to first line 31 is bonded, and a straight portion which electrically connects the arc-shaped portion and first terminal 21. The straight portion extends along the first direction described above. First line 31 is integrally patterned with first terminal 21, for example.

Second line 32 is disposed in second region 11b, and electrically connects second terminal 22 and the first electrode of second light-emitting element group 12b. Second line 32 includes an arc-shaped portion to which bonding wire 17 for electrically connecting second light-emitting element group 12b with second line 32 is bonded, and a straight portion which electrically connects the arc-shaped portion and second terminal 22. The straight portion extends along the second direction described above. Second line 32 is integrally patterned with second terminal 22, for example.

Third line 33 is disposed in third region 11c, and electrically connects third terminal 23 and the second electrode of second light-emitting element group 12b. Third line 33 includes an arc-shaped portion to which bonding wire 17 for electrically connecting second light-emitting element group 12b with third line 33 is bonded, and a straight portion which electrically connects the arc-shaped portion with third terminal 23. The straight portion extends along the first direction described above. Third line 33 is integrally patterned with third terminal 23, for example.

Fourth line 34 is disposed in fourth region 11d, and electrically connects fourth terminal 24 and the second electrode of first light-emitting element group 12a. Fourth line 34 includes an arc-shaped portion to which bonding wire 17 for electrically connecting first light-emitting element group 12a with fourth line 34 is bonded, and a straight portion which electrically connects the arc-shaped portion and fourth terminal 24. The straight portion extends along the second direction described above. Fourth line 34 is integrally patterned with fourth terminal 24, for example.

The arc-shaped portion of first line 31, the arc-shaped portion of second line 32, the arc-shaped portion of third line 33, and the arc-shaped portion of fourth line 34 described above extend along the circumference of a circle. Specifically, first line 31, second line 32, third line 33, and fourth line 34 each include an arc-shaped portion that extends along the circumference of a circle. The circumference is a circumference of a circle whose center is at the center (optical axis J) of light emission by light-emitting apparatus 10.

Next, first connecting line 41, second connecting line 42, and third connecting line 43 are described.

First connecting line 41 is disposed on the principal surface of substrate 11e, and electrically connects fifth terminal 25 and second terminal 22. One end of first connecting line 41 is connected with fifth terminal 25, and the other end of first connecting line 41 is connected with the arc-shaped portion of second line 32. First connecting line 41 is located outside of first line 31 and second line 32 in a plan view, and disposed in first region 11a and second region 11b. First connecting line 41 has an approximately arc shape that extends along the arc-shaped portion of first line 31 (the arc-shaped portion of second line 32).

Second connecting line 42 is disposed on the principal surface of substrate 11e, and electrically connects sixth terminal 26 and third terminal 23. One end of second connecting line 42 is connected with sixth terminal 26, and the other end of second connecting line 42 is connected with the arc-shaped portion of third line 33. Second connecting line 42 includes an arc-shaped portion located outside of first line 31 and connected with sixth terminal 26, and an arc-shaped portion located inside of fourth line 34 and connected with third line 33. Second connecting line 42 is disposed in first region 11a, fourth region 11d, and third region 11c. Note that bonding wire 17 which electrically connects first light-emitting element group 12a and fourth line 34 extends across second connecting line 42.

Third connecting line 43 is disposed on the principal surface of substrate 11e, and electrically connects seventh terminal 27 and fourth terminal 24. One end of third connecting line 43 is connected with seventh terminal 27, and the other end of third connecting line 43 is connected with the arc-shaped portion of fourth line 34. Third connecting line 43 is located outside of third line 33 and fourth line 34 in a plan view, and is disposed in third region 11c and fourth region 11d. Third connecting line 43 has an approximately arc shape which extends along the arc-shaped portion of third line 33 (the arc-shaped portion of fourth line 34).

[Light-Emitting Element Groups]

The following describes first light-emitting element group 12a and second light-emitting element group 12b. First light-emitting element group 12a and second light-emitting element group 12b are each formed by connecting LED chips 12 in series with bonding wires 17 using chip-to-chip bonding. Note that first light-emitting element group 12a and second light-emitting element group 12b may each include at least one LED chip 12.

LED chips 12 are examples of a light-emitting element, and disposed (mounted) on the principal surface of substrate 11e. LED chips 12 are, for example, blue LED chips formed using InGaN material and having a center wavelength (peak wavelength of an emission spectrum) of at least 430 nm and at most 480 nm. LED chips 12 thus emit blue light. LED chips 12 disposed on the principal surface of substrate 11e each emit light mainly upward (in the positive direction of the Z axis).

First light-emitting element group 12a is disposed in first region 11a and fourth region 11d of the principal surface of substrate 11e. First light-emitting element group 12a includes a light-emitting element row in which LED chips 12 are disposed in the Y-axis direction. The first electrode of first light-emitting element group 12a is electrically connected with first line 31 by bonding wire 17. Further, the second electrode of first light-emitting element group 12a is electrically connected with fourth line 34 by bonding wire 17 that extends across second connecting line 42.

Second light-emitting element group 12b is disposed in second region 11b and third region 11c of the principal surface of substrate 11e. Second light-emitting element group 12b includes a light-emitting element row in which LED chips 12 are disposed in the Y-axis direction. The first electrode of 15 second light-emitting element group 12b is electrically connected with second line 32 by bonding wire 17. The second electrode of second light-emitting element group 12b is electrically connected with third line 33 by bonding wire 17.

[Sealant]

Next, sealant 13 is described. Sealant 13 seals first light-emitting element group 12a, second light-emitting element group 12b, and bonding wires 17. Sealant 13 is disposed above first light-emitting element group 12a and second light-emitting element group 12b.

Sealant 13 has a function of protecting first light-emitting element group 12a, second light-emitting element group 12b, and bonding wires 17 from dust, moisture, external force, and others.

Sealant 13 is made of a light-transmitting resin material (base material) which includes phosphors. An example of the base material of sealant 13 is a methyl silicone resin, but an epoxy resin or a urea resin may be employed.

Sealant 13 includes green phosphors 14g and red phosphors 14r, for example. Specifically, green phosphors 14g are, for instance, yttrium aluminum garnet (YAG) phosphors having an emission peak wavelength of at least 550 nm and at most 570 nm or $Lu_3Al_5O_{12}:Ce^{3+}$ phosphors having an emission peak wavelength of at least 540 nm and at most 550 nm. Specifically, red phosphors 14r are, for example, $CaAlSiN_3:Eu^{2+}$ phosphors or $(Sr, Ca) AlSiN_3:Eu^{2+}$ phosphors having an emission peak wavelength of at least 610 nm and at most 620 nm.

The phosphors included in sealant 13 are not limited in particular. Sealant 13 may include phosphors which emit light by being excited by light emitted by LED chips 12. Filler may be included in sealant 13. The filler is silica particles having a diameter of about 10 nm, for example.

Inclusion of such filler prevents phosphors from settling since the filler provides resistance. This allows phosphors to be uniformly distributed in sealant 13.

If LED chips 12 included in first light-emitting element group 12a and second light-emitting element group 12b emit blue light, green phosphors 14g included in sealant 13 convert the wavelength of a portion of the emitted blue light so that green light is obtained. Furthermore, red phosphors 14r included in sealant 13 convert the wavelength of a portion of the emitted blue light so that red light is obtained. Blue light not absorbed by green phosphors 14g and red phosphors 14r, green light obtained as a result of wavelength conversion by green phosphors 14g, and red light obtained as a result of wavelength conversion by red phosphors 14r are diffused and mixed in sealant 13. Accordingly, white light is emitted through sealant 13.

The color temperature of white light is determined by adjusting the amounts of green phosphors 14g and red phosphors 14r included in sealant 13 (contents of green phosphors 14g and red phosphors 14r included in sealant 13). The color temperature of the white light falls in a range from 2700 K to 8000 K, for example.

[Annular Wall]

The following describes annular wall 15. Annular wall 15 externally surrounds first light-emitting element group 12a and second light-emitting element group 12b. Annular wall 15 is disposed on the principal surface of substrate 11e, and the lines disposed on the principal surface (first line 31, second line 32, third line 33, and fourth line 34). Specifically, each of first line 31, second line 32, third line 33, and fourth line 34 is at least partially disposed under annular wall 15 on substrate 11e. In a plan view, annular wall 15 has a ring shape whose center is at the center (optic axis) of light emission by light-emitting apparatus 10. Note that the shape of annular wall 15 is not limited in particular. For example, annular wall 15 may be formed into a quadrilateral annular shape.

Annular wall 15 also functions as a dam material for blocking sealant 13. Specifically, sealant 13 is disposed in a region surrounded by annular wall 15. For example, an insulating thermosetting resin or an insulating thermoplastic resin is used for annular wall 15. More specifically, silicone resin, phenol resin, epoxy resin, bismaleimide-triazine resin, or poly phthalamide (PPA) resin, for instance, is used for annular wall 15.

Annular wall 15 may have light reflection properties in order to increase light extraction efficiency of light-emitting apparatus 10. Thus, a resin has a white color (so-called white resin) is used for annular wall 15. Note that $TiO_2$ particles, $Al_2O_3$ particles, $ZrO_2$ particles, or $MgO$ particles, for instance, may be included in annular wall 15, in order to increase the light reflection properties of annular wall 15.

[Orientation of Light-Emitting Apparatus and Electrically Connected State of Light-Emitting Element Groups]

Figure 5:
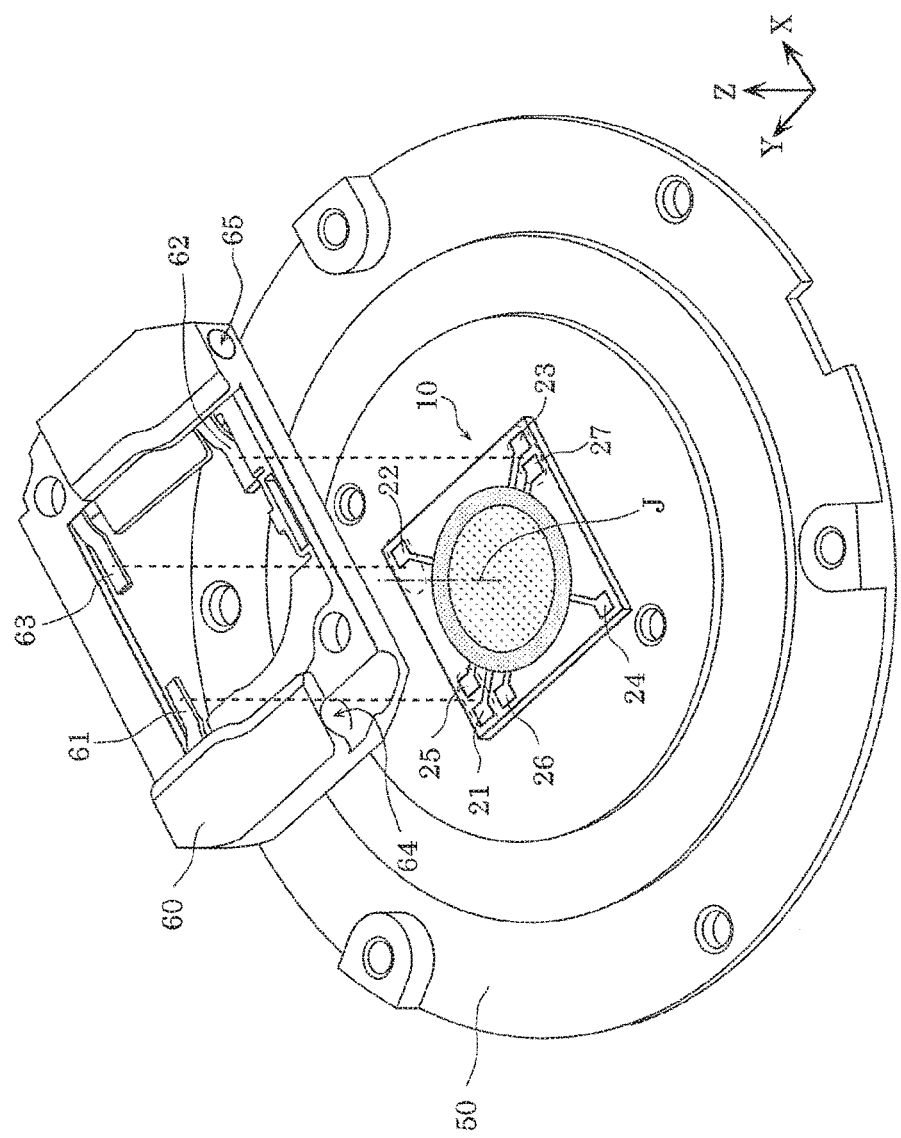
FIG. 5 is a diagram illustrating the light-emitting apparatus placed in a first orientation on a base member.
Figure 6:
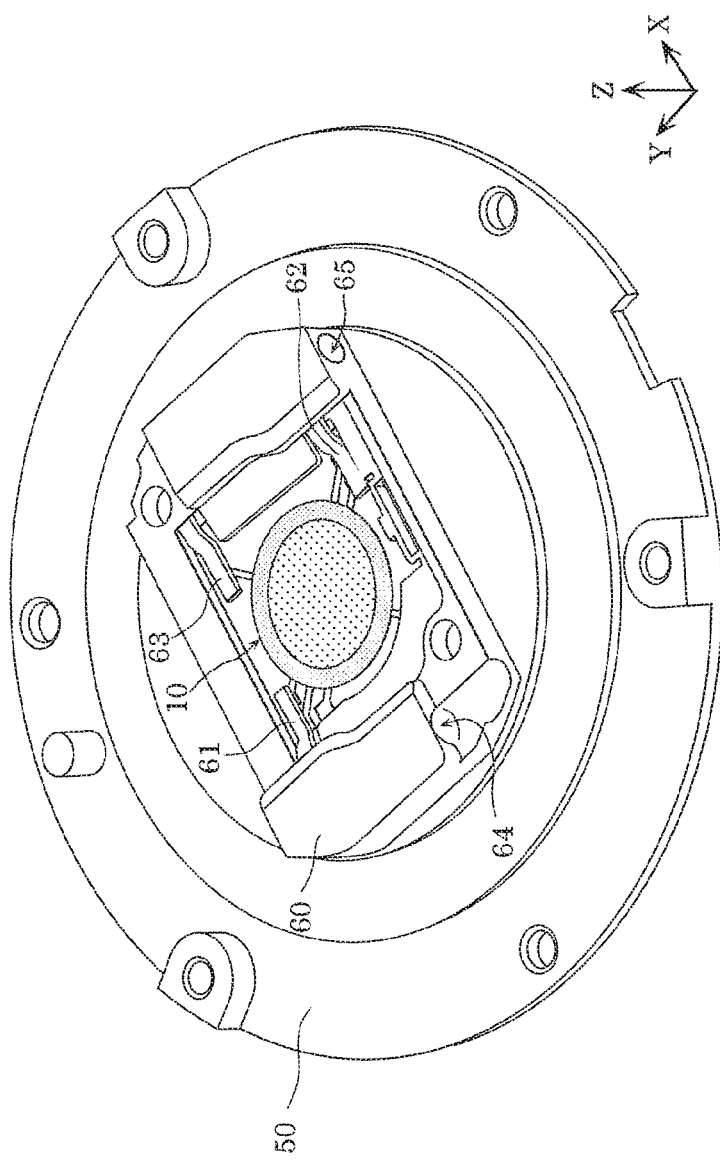
FIG. 6 is a diagram illustrating the light-emitting apparatus fixed to the base member.

Light-emitting apparatus 10 is placed on a base member, and is fixed to the base member by a holder, for example. FIG. 5 is a diagram illustrating light-emitting apparatus 10 placed on the base member. FIG. 6 is a diagram illustrating light-emitting apparatus 10 fixed to the base member.

As illustrated in FIGS. 5 and 6, light-emitting apparatus 10 is fixed by holder 60 in a state in which light-emitting apparatus 10 is placed on base member 50. Holder 60 is screwed to base member 50 in a state in which an edge portion of mounting substrate 11 of light-emitting apparatus 10 (a portion of mounting substrate 11 outside of annular wall 15) is sandwiched between base member 50 and holder 60.

Base member 50 is a member which has an approximately circular plate-like shape and on which light-emitting apparatus 10 is placed. Base member 50 functions also as a heat sink which dissipates heat generated by light-emitting apparatus 10. Base member 50 is formed using a metal material such as aluminum or a resin material having high heat conductivity, for example.

Holder 60 is a member for fixing light-emitting apparatus 10 to base member 50. Holder 60 is formed mainly using an insulating resin material such as polybutylene terephthalate resin.

Holder 60 is also used to electrically connect power supply leads to light-emitting apparatus 10. Specifically, holder 60 includes first pressing terminal 61, second pressing terminal 62, and third pressing terminal 63. First pressing terminal 61 is for supplying power to light-emitting apparatus 10, and is connected with a power supply lead passing through lead insertion hole 64. Second pressing terminal 62 is for supplying power to light-emitting apparatus 10, and is connected with a power supply lead passing through lead insertion hole 65. Third pressing terminal 63 is for short-circuiting terminals by collectively pressing the terminals. Third pressing terminal 63 is not connected with a power supply lead.

If holder 60 is screwed, first pressing terminal 61, second pressing terminal 62, and third pressing terminal 63 included in holder 60 press terminals included in light-emitting apparatus 10. Accordingly, the power supply lead passing through lead insertion hole 64 and at least one terminal of light-emitting apparatus 10 pressed by first pressing terminal 61 are electrically connected, and the power supply lead passing through lead insertion hole 65 and at least one terminal of light-emitting apparatus 10 pressed by second pressing terminal 62 are electrically connected.

Here, a user can readily change the electrically connected state of first light-emitting element group 12a and second light-emitting element group 12b included in light-emitting apparatus 10 by changing the orientation in which light-emitting apparatus 10 is mounted.

For example, when light-emitting apparatus 10 is placed in a first orientation on base member 50, each region surrounded by a dashed line is pressed by a pressing terminal, as illustrated in FIG. 5. Specifically, first pressing terminal 61 presses first terminal 21 and fifth terminal 25 collectively, second pressing terminal 62 presses third terminal 23 and seventh terminal 27 collectively, and third pressing terminal 63 presses second terminal 22. As a result, first terminal 21 and fifth terminal 25 are short-circuited, and third terminal 23 and seventh terminal 27 are short-circuited.

Figure 7:
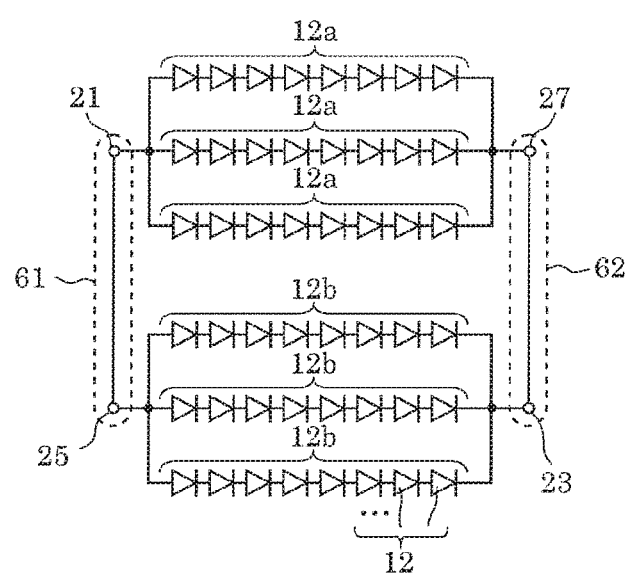
FIG. 7 is a diagram illustrating an electrical connection relationship of first light-emitting element groups and second light-emitting element groups when the light-emitting apparatus is placed in the first orientation.

In this case, a plurality of first light-emitting element groups 12a and a plurality of second light-emitting element groups 12b are connected in parallel as illustrated in FIG. 7. FIG. 7 is a diagram illustrating an electrical connection relationship of first light-emitting element groups 12a and second light-emitting element groups 12b when light-emitting apparatus 10 is placed in the first orientation. As illustrated in FIG. 7, when light-emitting apparatus 10 is placed in the first orientation, six groups of eight LED chips 12 connected in series are connected in parallel (8 in series and 6 in parallel).

Figure 8:
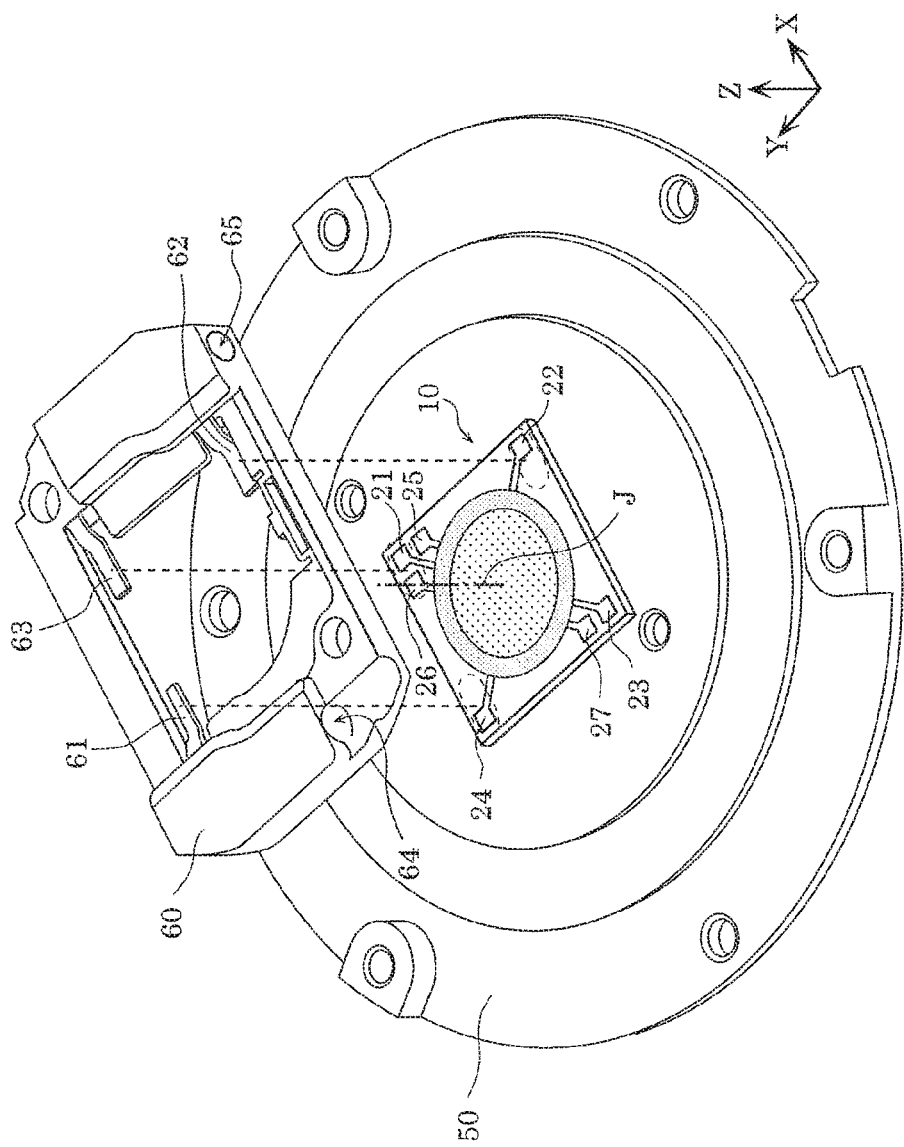
FIG. 8 is a diagram illustrating the light-emitting apparatus placed in a second orientation on the base member.

On the other hand, light-emitting apparatus 10 is disposed in a second orientation different from the first orientation in FIG. 8. FIG. 8 is a diagram illustrating light-emitting apparatus 10 placed in the second orientation on base member 50. The second orientation is an orientation in which light-emitting apparatus 10 in the first orientation is rotated 90 degrees about optical axis J (is rotated 90 degrees clockwise when viewed from above).

When light-emitting apparatus 10 is placed in the second orientation on base member 50, each region surrounded by a dashed line is pressed by a pressing terminal. Specifically, first pressing terminal 61 presses fourth terminal 24, second pressing terminal 62 presses second terminal 22, and third pressing terminal 63 collectively presses first terminal 21 and sixth terminal 26. As a result, first terminal 21 and sixth terminal 26 are short-circuited.

Figure 9:
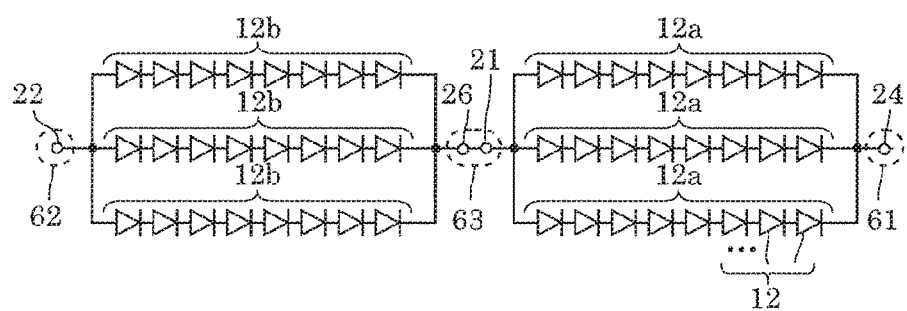
FIG. 9 is a diagram illustrating an electrical connection relationship of the first light-emitting element groups and the second light-emitting element groups when the light-emitting apparatus is placed in the second orientation.

In this case, as illustrated in FIG. 9, a plurality of first light-emitting element groups 12a and a plurality of second light-emitting element groups 12b are connected in series. FIG. 9 is a diagram illustrating an electrical connection relationship of first light-emitting element groups 12a and second light-emitting element groups 12b when light-emitting apparatus 10 is placed in the second orientation. As illustrated in FIG. 9, when light-emitting apparatus 10 is placed in the second orientation, the electrically connected state of a plurality of LED chips 12 is almost the same state as the state in which three groups of 16 LED chips 12 connected in series are connected in parallel (16 in series and 3 in parallel).

[Advantageous Effects and Others]

As described above, mounting substrate 11 is a mounting substrate on which first light-emitting element group 12a and second light-emitting element group 12b are mounted. Mounting substrate 11 includes substrate 11e having a principal surface which includes first region 11a, second region 11b, third region 11c, and fourth region 11d, and in which first region 11a and third region 11c are aligned in a first direction, and second region 11b and fourth region 11d are aligned in a second direction which crosses the first direction; first terminal 21 which is disposed in first region 11a, and is electrically connected with a first electrode of first light-emitting element group 12a; second terminal 22 which is disposed in second region 11b, and is electrically connected with a first electrode of second light-emitting element group 12b; third terminal 23 which is disposed in third region 11c, and is electrically connected with a second electrode of second light-emitting element group 12b; fourth terminal 24 which is disposed in fourth region 11d, and is electrically connected with a second electrode of first light-emitting element group 12a; fifth terminal 25 disposed in first region 11a; sixth terminal 26 disposed in first region 11a; seventh terminal 27 disposed in third region 11c; first connecting line 41 which is disposed on the principal surface, and electrically connects fifth terminal 25 and second terminal 22; second connecting line 42 which is disposed on the principal surface, and electrically connects sixth terminal 26 and third terminal 23; and third connecting line 43 which is disposed on the principal surface, and electrically connects seventh terminal 27 and fourth terminal 24.

Accordingly, if the electrically connected state of first terminal 21 to seventh terminal 27 (for example, whether a terminal is short-circuited with another terminal disposed in the same region) is changed, mounting substrate 11 can change the electrical connection relationship of first mounted light-emitting element group 12a and second light-emitting element group 12b which are already mounted.

In a plan view, imaginary line VL1 which connects first terminal 21 and third terminal 23 may be as long as and orthogonal to imaginary line VL2 which connects second terminal 22 and fourth terminal 24. A distance between first terminal 21 and second terminal 22, a distance between second terminal 22 and third terminal 23, a distance between third terminal 23 and fourth terminal 24, and a distance between fourth terminal 24 and first terminal 21 may be equal.

Accordingly, even if the orientation of light-emitting apparatus 10 is rotated 90 degrees, the arrangement of four terminals, namely first terminal 21 to fourth terminal 24 does not change. Accordingly, the electrical connection relationship of first light-emitting element group 12a and second light-emitting element group 12b is readily changed using positions in which the pressing terminals included in holder 60 as described above apply pressure.

In the plan view, fifth terminal 25 may be located on imaginary line VL3 which connects first terminal 21 and second terminal 22, sixth terminal 26 may be located on imaginary line VL4 which connects first terminal 21 and fourth terminal 24, and seventh terminal 27 may be located on imaginary line VL5 which connects third terminal 23 and fourth terminal 24.

Accordingly, the electrical connection relationship of first light-emitting element group 12a and second light-emitting element group 12b is readily changed using positions in which the pressing terminals included in holder 60 as described above apply pressure.

Furthermore, a distance between first terminal 21 and fifth terminal 25, a distance between first terminal 21 and sixth terminal 26, and a distance between third terminal 23 and seventh terminal 27 may be equal.

Accordingly, the electrical connection relationship of first light-emitting element group 12a and second light-emitting element group 12b is readily changed using positions in which the pressing terminals included in holder 60 as described above apply pressure.

Substrate 11e may have a quadrilateral shape in a plan view, first terminal 21 may be disposed in first corner portion 11a1 included in first region 11a, and second terminal 22 may be disposed in second corner portion 11b1 included in second region 11b. Third terminal 23 may be disposed in third corner portion 11c1 included in third region 11c1 and located diagonally opposite first corner portion 11a1, and fourth terminal 24 may be disposed in fourth corner portion 11d1 included in fourth region 11d and located diagonally opposite second corner portion 11b1.

Accordingly, first terminal 21 to fourth terminal 24 are disposed in corner portions of substrate 11e where pressure is readily applied, and thus a structure of pressing first terminal 21 to fourth terminal 24 (for example, pressing terminals) can be simplified. Furthermore, the structure of pressing first terminal 21 to fourth terminal 24 (for example, pressing terminals) can be prevented from blocking light emitted from a light-emitting portion (which is a region where the light-emitting element groups are mounted).

Mounting substrate 11 may further include: first line 31 which is disposed in first region 11a, and electrically connects first terminal 21 and the first electrode of first light-emitting element group 12a; second line 32 which is disposed in second region 11b, and electrically connects second terminal 22 and the first electrode of second light-emitting element group 12b. Mounting substrate 11 may include: third line 33 which is disposed in third region 11c, and electrically connects third terminal 23 and the second electrode of second light-emitting element group 12b; and fourth line 34 which is disposed in fourth region 11d, and electrically connects fourth terminal 24 and the second electrode of first light-emitting element group 12a.

Accordingly, a terminal is connected with a light-emitting element group by a line, and thus the terminal can be disposed in a position away from the light-emitting portion. Thus, the structure of pressing first terminal 21 to fourth terminal 24 (for example, pressing terminals) can be prevented from blocking light emitted from the light-emitting portion.

First line 31, second line 32, third line 33, and fourth line 34 may each include an arc-shaped portion which extends along a circumference of a circle.

Accordingly, the light-emitting portion (which is a region where the light-emitting element groups are mounted) is readily given a round shape.

Light-emitting apparatus 10 includes: mounting substrate 11 according to any of the above aspects; and first light-emitting element group 12a and second light-emitting element group 12b which are mounted on mounting substrate 11.

Accordingly, if the electrically connected state of first terminal 21 to seventh terminal 27 is changed, light-emitting apparatus 10 can change the electrical connection relationship of first light-emitting element group 12a and second light-emitting element group 12b which are already mounted.

Light-emitting apparatus 10 may include: a plurality of first light-emitting element group 12a; and a plurality of second light-emitting element group 12b.

Accordingly, if the electrically connected state of first terminal 21 to seventh terminal 27 is changed, light-emitting apparatus 10 can change the electrical connection relationship of first light-emitting element group 12a and second light-emitting element group 12b which are already mounted.

Embodiment 2

Figure 10:
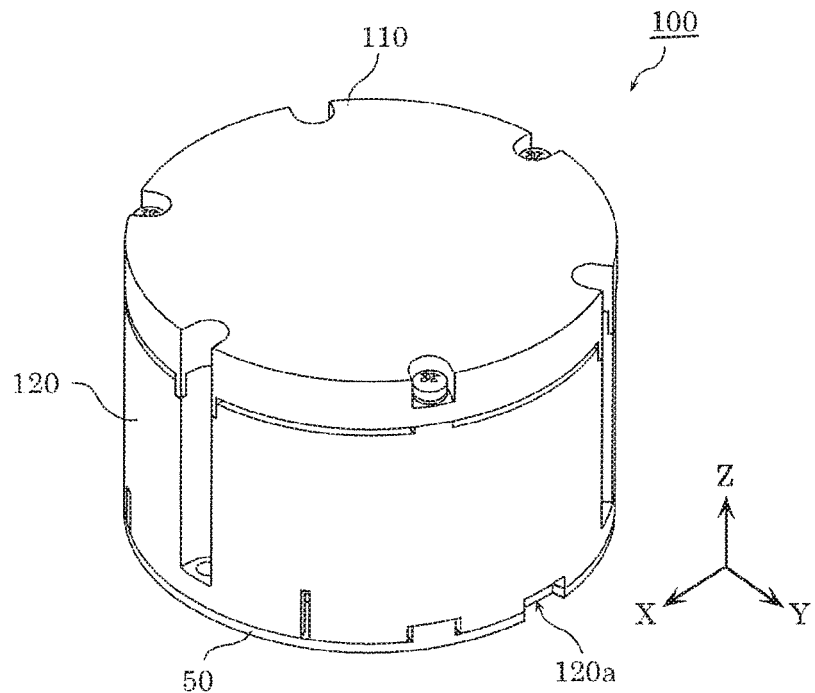
FIG. 10 is an external perspective view of an illumination apparatus according to Embodiment 2.
Figure 11:
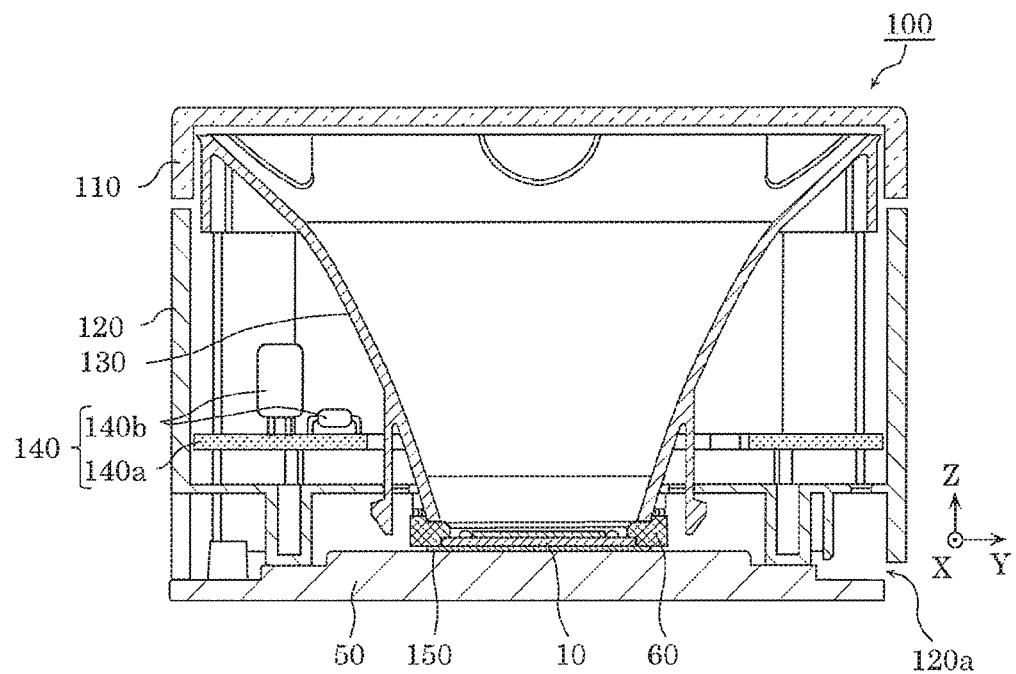
FIG. 11 is a schematic cross sectional view of the illumination apparatus according to Embodiment 2.

Next, Embodiment 2 describes an illumination apparatus which includes light-emitting apparatus 10. FIG. 10 is an external perspective view of the illumination apparatus according to Embodiment 2. FIG. 11 is a schematic cross sectional view of the illumination apparatus according to Embodiment 2.

Illumination apparatus 100 illustrated in FIGS. 10 and 11 is used as a downlight or a spotlight, for example. Illumination apparatus 100 includes light-transmitting panel 110, casing 120, reflection member 130, power supply module 140, and heat conduction sheet 150, in addition to light-emitting apparatus 10, base member 50, and holder 60.

Light-transmitting panel 110 is an optical member having a cap shape (a lid shape) formed with a light-transmitting material, in order to extract light emitted by light-emitting apparatus 10 to the outside. Light-transmitting panel 110 has an approximately round shape in a plan view. Note that light-transmitting panel 110 may have a particular optical property such as a function as a Fresnel lens.

Casing 120 is a member which has an approximately cylindrical shape, and houses light-emitting apparatus 10 and power supply module 140. Casing 120 has a first opening formed on the light exiting side, and a second opening formed on a side opposite the light exiting side. A light-exiting side portion of reflection member 130 is located at the first opening, and a light-entering portion of reflection member 130 is located at the second opening. Casing 120 is formed using an insulating resin material such as a polybutylene terephthalate resin, for example, yet may be formed using metal such as aluminum.

Reflection member 130 has a reflecting function, and has a light-entering opening through which light emitted by light-emitting apparatus 10 enters, and a light-exiting opening through which light that has entered through the light-entering opening exits. Reflection member 130 is a cylindrical truncated cone having an inside diameter which gradually increases from the light-entering opening to the light-exiting opening. In other words, reflection member 130 has a trumpet-shape (funnel shape).

The inner surface of reflection member 130 is a reflective surface which reflects light emitted by light-emitting apparatus 10. The reflective surface reflects light which has entered through the light-entering opening so that the light travels toward the light-exiting opening. In other words, light emitted by light-emitting apparatus 10 is guided to light-transmitting panel 110 by reflection member 130.

Reflection member 130 is formed using an insulating white resin material, for example. The inner surface of reflection member 130 may be coated with a metal-evaporated film (reflective metal film) made of a metal material such as silver or aluminum. Reflection member 130 may be formed using a metal material such as aluminum, which has a reflectance higher than that of a resin material.

Power supply module 140 is for supplying power for causing light-emitting apparatus 10 to emit light. Power supply module 140 is configured by mounting a plurality of circuit elements 140b on substrate 140a.

Substrate 140a has an approximately ring-shaped (doughnut-shaped) substrate. Substrate 140a is disposed inside casing 120 and outside reflection member 130. Lines for electrically connecting circuit elements 140b are patterned on substrate 140a. Specifically, substrate 140a is a ceramic substrate, a resin substrate, or a metal-based substrate.

Circuit elements 140b are included in a power supply circuit which supplies, between first pressing terminal 61 and second pressing terminal 62, power for causing light-emitting apparatus 10 to emit light. An electric line (not illustrated) passing through insertion hole 120a of casing 120 is electrically connected with the power supply circuit. In addition, a power supply lead passing through lead insertion hole 64 of holder 60 described in Embodiment 1 and a power supply lead passing through lead insertion hole 65 of holder 60 described in Embodiment 1 are also electrically connected with the power supply circuit.

For example, the power supply circuit converts, into direct-current power, alternating-current power supplied from the outside of illumination apparatus 100 via the electric line passing through insertion hole 120a, and outputs direct-current power to the power supply lead. Specifically, the power supply circuit supplies, between first pressing terminal 61 and second pressing terminal 62 included in holder 60, power for causing light-emitting apparatus 10 to emit light.

Examples of circuit element 140b include a capacitive element such as an electrolytic capacitor or a ceramic capacitor, a resistance element, a coil element, a choking coil (choke transformer), a noise filter, a diode, and an integrated circuit element.

Heat conduction sheet 150 has a quadrilateral shape in a plan view, and is disposed between light-emitting apparatus 10 and base member 50. Heat conduction sheet 150 is for dissipating heat generated in light-emitting apparatus 10 to base member 50. Specifically, heat conduction sheet 150 has high heat conductivity and is formed using a resin material, and is a silicon sheet or an acrylic sheet, for example.

Advantageous Effects and Others of Embodiment 2

As described above, illumination apparatus 100 includes: light-emitting apparatus 10; base member 50 on which light-emitting apparatus 10 is placed; holder 60 which includes first pressing terminal 61, second pressing terminal 62, and third pressing terminal 63, and fixes light-emitting apparatus 10 to base member 50; and circuit element 140b included in a power supply circuit which supplies, between first pressing terminal 61 and second pressing terminal 62, power for causing light-emitting apparatus 10 to emit light. As illustrated in FIG. 5, when light-emitting apparatus 10 is placed in a first orientation, first pressing terminal 61 collectively presses first terminal 21 and fifth terminal 25, second pressing terminal 62 collectively presses third terminal 23 and seventh terminal 27, and third pressing terminal 63 presses second terminal 22. As illustrated in FIG. 8, when light-emitting apparatus 10 is placed in a second orientation rotated 90 degrees from the first orientation about an optical axis, first pressing terminal 61 presses fourth terminal 24, second pressing terminal 62 presses second terminal 22, and third pressing terminal 63 collectively presses first terminal 21 and sixth terminal 26.

Accordingly, light-emitting apparatus 10 can switch between whether first light-emitting element group 12a and second light-emitting element group 12b are connected in series or in parallel by changing the orientation in which light-emitting apparatus 10 is mounted.

Note that illumination apparatus 100 is achieved as a downlight or a spotlight in Embodiment 2, yet the present disclosure may be achieved as an illumination apparatus according to another aspect, which includes light-emitting apparatus 10.

OTHER EMBODIMENTS

The above completes description of the embodiments, yet the present disclosure is not limited to the embodiments above.

In the above embodiments, the light-emitting apparatus outputs while light by combining LED chips which emit blue light with green phosphors and red phosphors, yet a configuration for outputting white light is not limited to this.

For example, LED chips which emit blue light may be combined with yellow phosphors. Stated differently, the sealant may include yellow phosphors. Alternatively, ultraviolet LED chips which output ultraviolet light having a shorter wavelength than the wavelength of blue light emitted by LED chips may be combined with blue phosphors, green phosphors, and red phosphors which emit blue light, green light, and red light, respectively, by being excited mainly by ultraviolet light. Specifically. LED chips may emit ultraviolet light, and the sealant may include blue phosphors, green phosphors, and red phosphors.

A light-emitting apparatus may emit light having a color other than white. For example, if a light-emitting apparatus emits blue light, the sealant may not include phosphors.

In the above embodiments, an LED chip mounted on the substrate is connected with another LED chip by a bonding wire using chip-to-chip bonding. However, an LED chip may be connected, by a bonding wire, with a line (metal film) provided on a substrate, and electrically connected with another LED chip via the line.

In the above embodiments, an LED chip is described as an example of a light-emitting element used for the light-emitting apparatus. However, solid light-emitting elements of other types including a semiconductor light-emitting element such as a semiconductor laser and an electroluminescent (EL) element such as an organic EL element or an inorganic EL element may be employed as the light-emitting element.

In addition, in the above embodiments, the light-emitting apparatus is of a COB type, but may be of a surface mount device (SMD) type. Specifically, SMD-type LED elements may be mounted as light-emitting elements on the principal surface of the substrate, instead of LED chips. A surface mount type LED element is a packaged type element obtained by mounting an LED chip in a resin-molded cavity, and filling the cavity with a phosphor-containing resin. Such an SMD type light-emitting apparatus does not include a sealant and an annular wall, for instance.

The present disclosure also includes embodiments as a result of adding various modifications to the embodiments that may be conceived by those skilled in the art, and embodiments obtained by combining elements and functions in the embodiments in any manner as long as the combination does not depart from the scope of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A mounting substrate on which a first light-emitting element group and a second light-emitting element group are mounted, the mounting substrate comprising:
    a substrate having a principal surface which includes a first region, a second region, a third region, and a fourth region, and in which the first region and the third region are aligned in a first direction and the second region and the fourth region are aligned in a second direction which crosses the first direction;
    a first terminal which is disposed in the first region, and is electrically connected with a first electrode of the first light-emitting element group;
    a second terminal which is disposed in the second region, and is electrically connected with a first electrode of the second light-emitting element group;
    a third terminal which is disposed in the third region, and is electrically connected with a second electrode of the second light-emitting element group;
    a fourth terminal which is disposed in the fourth region, and is electrically connected with a second electrode of the first light-emitting element group;
    a fifth terminal disposed in the first region;
    a sixth terminal disposed in the first region;
    a seventh terminal disposed in the third region;
    a first connecting line which is disposed on the principal surface, and electrically connects the fifth terminal and the second terminal;
    a second connecting line which is disposed on the principal surface, and electrically connects the sixth terminal and the third terminal; and
    a third connecting line which is disposed on the principal surface, and electrically connects the seventh terminal and the fourth terminal.

2. The mounting substrate according to claim 1, wherein in a plan view, an imaginary line which connects the first terminal and the third terminal is as long as and orthogonal to an imaginary line which connects the second terminal and the fourth terminal, and
    a distance between the first terminal and the second terminal, a distance between the second terminal and the third terminal, a distance between the third terminal and the fourth terminal, and a distance between the fourth terminal and the first terminal are equal.

3. The mounting substrate according to claim 2, wherein in the plan view,
the fifth terminal is located on an imaginary line which connects the first terminal and the second terminal,
the sixth terminal is located on an imaginary line which connects the first terminal and the fourth terminal, and
the seventh terminal is located on an imaginary line which connects the third terminal and the fourth terminal.

4. The mounting substrate according to claim 3, wherein a distance between the first terminal and the fifth terminal, a distance between the first terminal and the sixth terminal, and a distance between the third terminal and the seventh terminal are equal.

5. The mounting substrate according to claim 1, wherein the substrate has a quadrilateral shape in a plan view,
the first terminal is disposed in a first corner portion included in the first region,
the second terminal is disposed in a second corner portion included in the second region,
the third terminal is disposed in a third corner portion included in the third region and located diagonally opposite the first corner portion, and
the fourth terminal is disposed in a fourth corner portion included in the fourth region and located diagonally opposite the second corner portion.

6. The mounting substrate according to claim 1, further comprising:
a first line which is disposed in the first region, and electrically connects the first terminal and the first electrode of the first light-emitting element group;
a second line which is disposed in the second region, and electrically connects the second terminal and the first electrode of the second light-emitting element group;
a third line which is disposed in the third region, and electrically connects the third terminal and the second electrode of the second light-emitting element group; and
a fourth line which is disposed in the fourth region, and electrically connects the fourth terminal and the second electrode of the first light-emitting element group.

7. The mounting substrate according to claim 6, wherein the first line, the second line, the third line, and the fourth line each include an arc-shaped portion which extends along a circumference of a circle.

8. A light-emitting apparatus, comprising:
the mounting substrate according to claim 1;
the first light-emitting element group mounted on the mounting substrate; and
the second light-emitting element group mounted on the mounting substrate.

9. The light-emitting apparatus according to claim 8, wherein
the first light-emitting element group comprises a plurality of first light-emitting element groups, and
the second light-emitting element group comprises a plurality of second light-emitting element groups.

10. The light-emitting apparatus according to claim 8, further comprising:
a sealant which seals the first light-emitting element group and the second light-emitting element group.

11. The light-emitting apparatus according to claim 10, wherein
the sealant includes a phosphor which emits light by being excited by light emitted by the first light-emitting element group and light emitted by the second light-emitting element group.

12. The light-emitting apparatus according to claim 10, further comprising:
an annular wall surrounding the sealant, wherein
the annular wall is disposed on the principal surface and a line disposed on the principal surface.

13. The light-emitting apparatus according to claim 12, wherein
the sealant has a round shape and the annular wall has a ring shape when the sealant and the annular wall are viewed perpendicularly to the principal surface.

14. An illumination apparatus, comprising:
the light-emitting apparatus according to claim 8;
a base member on which the light-emitting apparatus is placed;
a holder which includes a first pressing terminal, a second pressing terminal, and a third pressing terminal, and fixes the light-emitting apparatus to the base member; and
a circuit element included in a power supply circuit which supplies, between the first pressing terminal and the second pressing terminal, power for causing the light-emitting apparatus to emit light, wherein
when the light-emitting apparatus is placed in a first orientation,
the first pressing terminal collectively presses the first terminal and the fifth terminal,
the second pressing terminal collectively presses the third terminal and the seventh terminal, and
the third pressing terminal presses the second terminal, and
when the light-emitting apparatus is placed in a second orientation rotated 90 degrees from the first orientation about an optical axis,
the first pressing terminal presses the fourth terminal,
the second pressing terminal presses the second terminal, and
the third pressing terminal collectively presses the first terminal and the sixth terminal.

15. The illumination apparatus according to claim 14, wherein
when the light-emitting apparatus is placed in the first orientation, the first light-emitting element group and the second light-emitting element group are connected in parallel, and
when the light-emitting apparatus is placed in the second orientation, the first light-emitting element group and the second light-emitting element group are connected in series.

* * * * *